US006632576B2

(12) United States Patent
Tejnil (10) Patent No.: US 6,632,576 B2
(45) Date of Patent: Oct. 14, 2003

(54) OPTICAL ASSIST FEATURE FOR TWO-MASK EXPOSURE LITHOGRAPHY

(75) Inventor: Edita Tejnil, San Carlos, CA (US)

(73) Assignee: Intel Corporation, Santa Clara, CA (US)

(*) Notice: Subject to any disclaimer, the term of this patent is extended or adjusted under 35 U.S.C. 154(b) by 75 days.

(21) Appl. No.: 09/751,175

(22) Filed: Dec. 30, 2000

(65) Prior Publication Data

US 2002/0086218 A1 Jul. 4, 2002

(51) Int. Cl.$^7$ ............................... G03F 9/00; G03C 5/00
(52) U.S. Cl. ....................................... 430/5; 430/394
(58) Field of Search ............................. 430/5, 311, 313, 430/322, 324, 394; 716/19, 20, 21; 378/35

(56) References Cited

U.S. PATENT DOCUMENTS 6,503,666 B1 * 1/2003 Pierrat ........................... 430/5

* cited by examiner

*Primary Examiner*—S. Rosasco
(74) *Attorney, Agent, or Firm*—George Chen (57) ABSTRACT

The present invention claims a binary mask printing a product feature which includes a narrow space; and a phase-shifting mask having an assist feature that fits within the narrow space when both masks are properly aligned in exposing a wafer.

15 Claims, 8 Drawing Sheets

OPTICAL ASSIST FEATURE FOR TWO-MASK EXPOSURE LITHOGRAPHY

BACKGROUND OF THE INVENTION

1. Field of the Invention

The present invention relates to the field of semiconductor integrated circuit (IC) manufacturing, and more specifically, to a method of using optical assist features to enhance process latitude for features printed with two mask exposures.

2. Discussion of Related Art

Integrated circuits (IC) are generally fabricated on a semiconductor substrate, such as a Silicon wafer. The process of lithography, in conjunction with the process of etching, is used to pattern features in thin film stacks that have been formed on the wafer. At each layer of the fabrication, the wafer is first coated with photoresist which is a material that is sensitive to radiation, such as deep ultraviolet (DUV) light. Next, the wafer is exposed to light through a mask in an exposure tool, such as a step-and-scan tool. Then the photoresist is developed to produce an image corresponding to the pattern on the mask. Next, an etch process transfers the pattern into the thin film stacks on the wafer. Finally, the photoresist is removed.

When features in a pattern become smaller than the wavelength of light used for exposure, diffraction effects will degrade the fidelity of the printed image. Consequently, advanced lithography processes often require exposure with two separate masks to print the desired patterns for a critical layer. One exposure is performed with a phase-shifting mask (PSM) to print the small features in the desired pattern. Another exposure is performed with a binary mask to remove artifacts unavoidably printed by the PSM. In addition, the binary mask also prints the large features in the desired pattern.

As the critical dimension (CD) of the features in the desired pattern continues to shrink, phase conflicts make it increasingly difficult to print all of the small features with the PSM. Consequently, some of the small features may have to be printed with the binary mask although it is not capable of as fine a resolution as the PSM.

Several options are available, but all of them are costly. One possibility is to print some of the small features on a third mask, but throughput will be reduced by the additional exposure and overlay of the masks will be difficult to control. Another possibility is to increase the numerical aperture (NA) of the step-and-scan exposure tool, thus improving resolution, but the depth-of-focus will be reduced and process latitude will be degraded. A further possibility is to improve the resolution of the photoresist, but both the exposure process and etch process will have to be re-optimized.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes an apparatus for and a method of improving definition of a product feature with a two-mask exposure process in lithography. One application of the present invention involves the printing of small spaces on a critical layer, such as the polysilicon gate layer. Controlling the shapes and dimensions of the gates is required to match drive currents and to reduce transistor leakage.

According to one embodiment of the present invention, a transparent shape called an assist feature is added at one location on one mask in order to modify the exposure of a narrow space at an equivalent location on the other mask. When the two masks are properly aligned, the assist feature on one mask will fit within the narrow space on the other mask. Exposure with the two masks will enhance the definition of the product features separated by the narrow space.

The assist feature is essentially "invisible" since it does not appear explicitly in the image printed in the photoresist on the wafer. However, the process latitude is enhanced globally by increasing the fidelity of a product feature locally. Sensitivity to variation in exposure dose and focus is minimized significantly. The incidence of defects in the product feature is also reduced. Such defects may include bridging of product features separated by a narrow space, necking down of narrow product features, rounding of corners in product features, and shortening of line ends in product features.

The "hidden-shifter" alternating aperture phase-shifting mask (PSM) approach is an example of a two-mask exposure process that can incorporate the assist feature of the present invention. "Phase-shifting" refers to introducing an offset between the phase of light transmitted through adjacent transparent regions. The phase of the light in adjacent transparent regions is usually chosen to be 0 degree and 180 degrees. Other phases, such as 90 degrees and 270 degrees, may be implemented in adjacent transparent regions, as long as the phase difference remains 180 degrees. "Aperture" refers to a transparent region in the mask. "Alternating" refers to every other aperture. "Hidden shifter" refers to using a binary mask to remove undesired parts of features that would otherwise be printed along phase-shifted boundaries between adjacent transparent regions.

Figure 1:
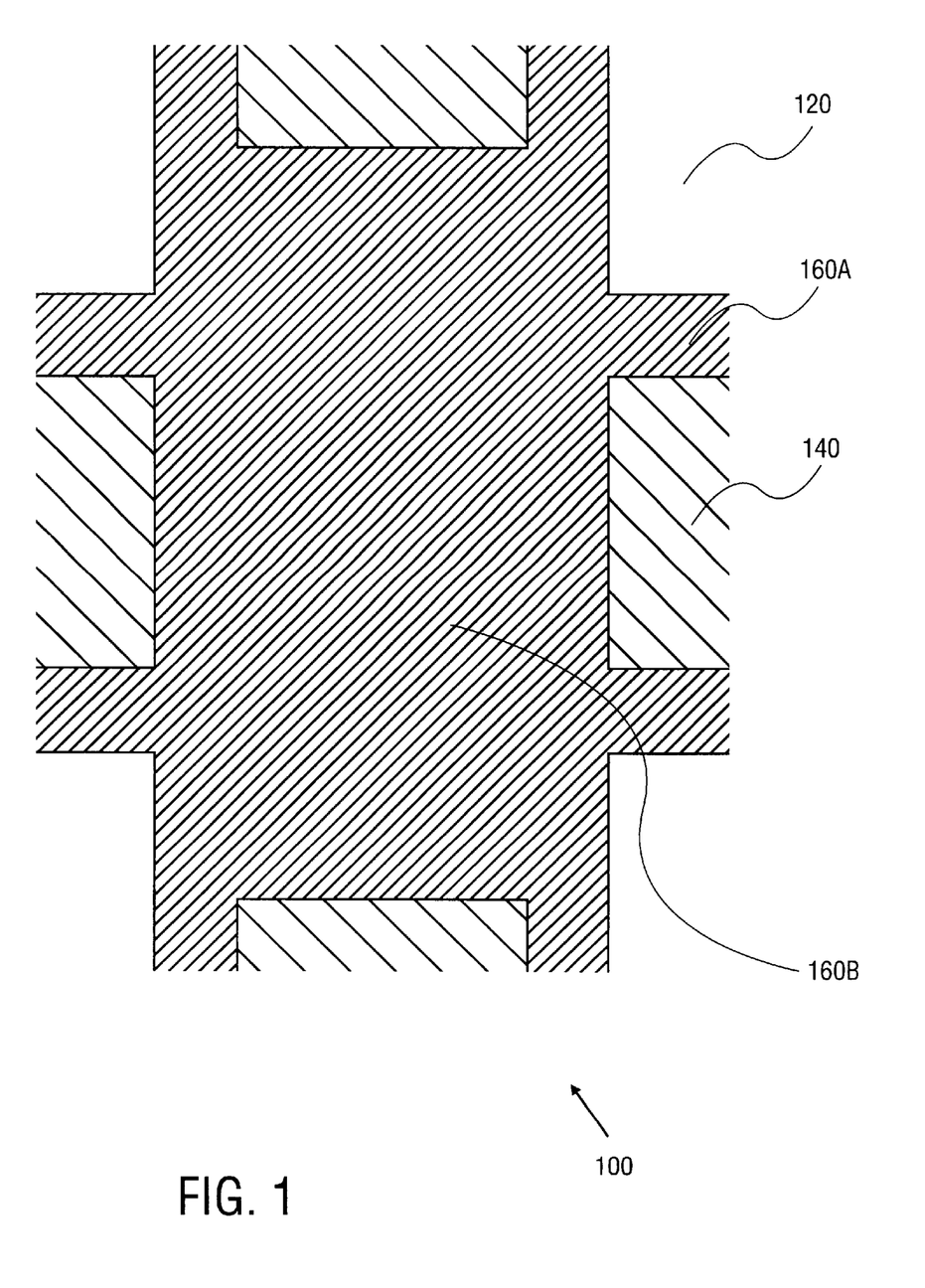
FIG. 1 is an illustration of a phase-shifting mask in the prior art.

One mask is a PSM 100, as shown in FIG. 1. The PSM 100 has a first transparent region 120 with a phase of 0 degree, a second transparent region 140 with a phase of 180 degrees, and an opaque region having a narrow region 160*a* and a wide region 160*b*. The narrow opaque region 160*a* on the PSM 100 may define small product features in the desired pattern. In this situation, the narrow opaque region 160a is located along a boundary between a first transparent region 120 with a phase of 0 degree and a second transparent region 140 with a phase of 180 degrees. The offset in phase of 180 degrees allows resolution to be enhanced by interference along the boundary.

The narrow opaque region 160a on the PSM 100 may also be located along a boundary between two transparent regions of the same phase (not shown), either both 0 degree or both 180 degrees. Then there will be no phase-shifting and the printed product feature will not be as small. This situation may occur due to unavoidable phase conflicts.

The narrow opaque region 160a on the PSM 100 may even have zero width (not shown). In other words it may be absent (not shown) along the boundary between a first transparent region 120 with a phase of 0 degree and a second transparent region 140 with a phase of 180 degrees. This special case is called phase-edge shifting and will usually print a product feature with the smallest size.

The wide opaque region 160b on the PSM 100 may be used in at least two ways. First, they can protect areas that are printed by the binary mask 200 of FIG. 2. Second, they can print some or all of the large features in the desired pattern. Since improving resolution is usually less critical for the wide opaque region 160b, the wide opaque region 160b may be located along a boundary between two transparent regions that have the same phase or that have different phases.

The PSM 100 in FIG. 1 may be a darkfield or a brightfield mask. In a darkfield mask, the features are mostly defined by transparent regions. In a brightfield mask, the features are mostly defined by opaque regions. The choice of a darkfield or a brightfield mask is made in conjunction with many other factors, such as the tone of the photoresist (positive or negative) used to pattern the mask, the total amount of data and the associated time needed to write the mask, the micro-loading during the etch process for the mask, the susceptibility to scattered light when the mask is used in a step-and-scan exposure tool, and the sensitivity of the product to opaque versus clear defects on the given layer.

Figure 2:
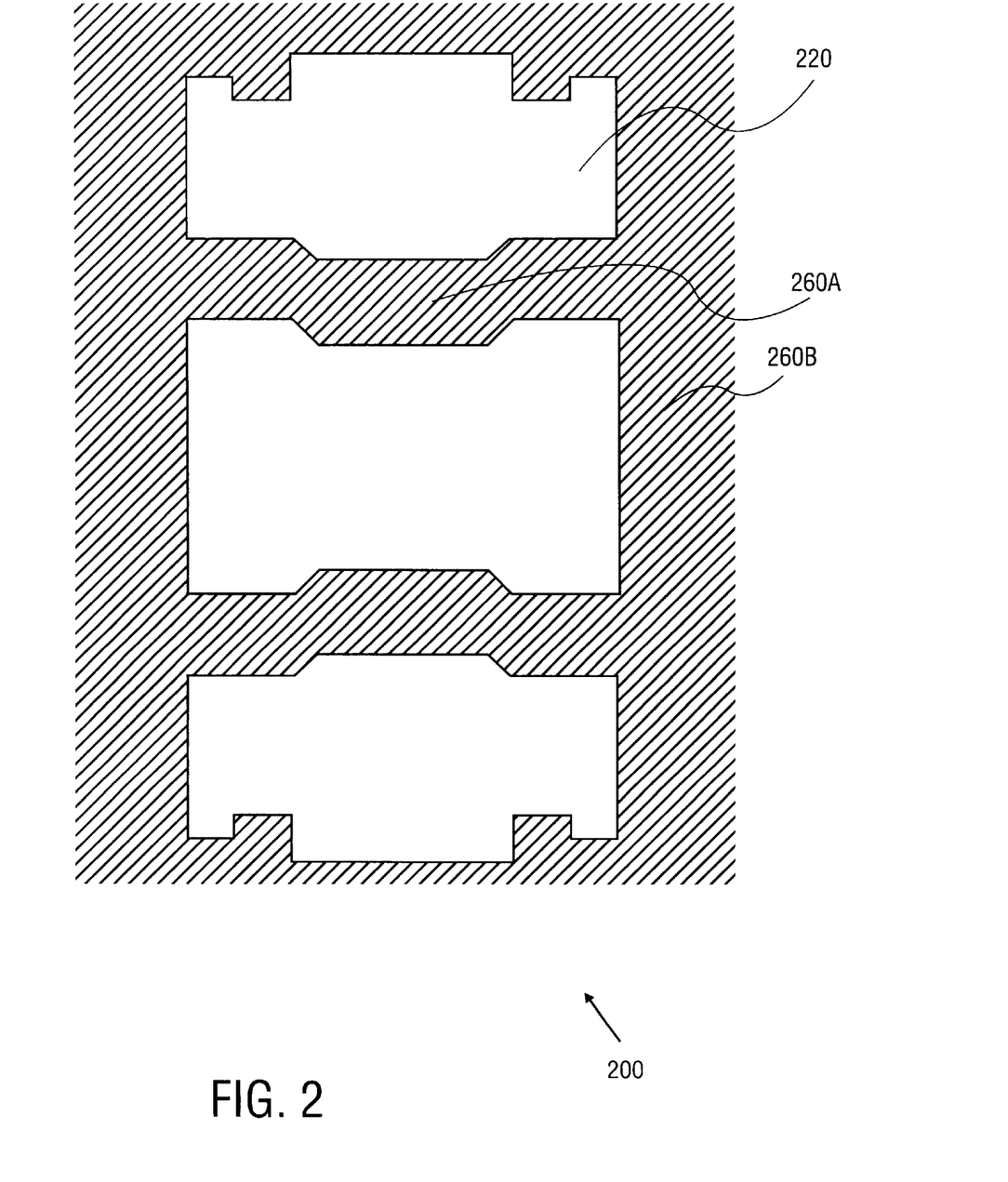
FIG. 2 is an illustration of a binary mask in the prior art.

The other mask is a binary mask 200, as shown in FIG. 2. The binary mask 200 has a transparent region 220 and an opaque region having a narrow region 260a and a wide region 260b. Since no phase-shifting occurs with the binary mask 200, the transparent region 220 may have any phase, including 0 degree, as long as it is uniform.

The binary mask 200 may be used in at least three ways. First, the wide opaque region 260b may protect areas that are printed by the PSM 100 as shown in FIG. 1. Second, the narrow opaque region 260a, together with the adjacent transparent region 220, may print some or all of the large features in the desired pattern. If desired, the adjacent transparent region 220 may be as narrow or even narrower than the narrow opaque region 260a. Third, the transparent region 220 may trim or remove artifacts printed by the PSM 100. Artifacts often cannot be avoided because phase-shifting occurs at the boundary between adjacent transparent areas having a difference in phase. Such transparent areas are necessarily two-dimensional, regardless of whether a narrow opaque area separates the adjacent transparent areas.

In a two-mask exposure process, the PSM 100 of FIG. 1 is usually exposed before the binary mask 200 of FIG. 2, but, in certain cases, the sequence is reversed. In either case, the overlap of the features on the two masks must be designed to accommodate the cumulative variation in overlay expected to result from any misalignment of the two masks on the step-and-scan tool, any distortion of the wafer from thermal cycling, and any process bias from the lithography, thin film, and etch processes. Appropriate design and implementation of the overlap of the features on the two masks will prevent the production of artifacts during etching of the pattern printed on a wafer.

Figure 3:
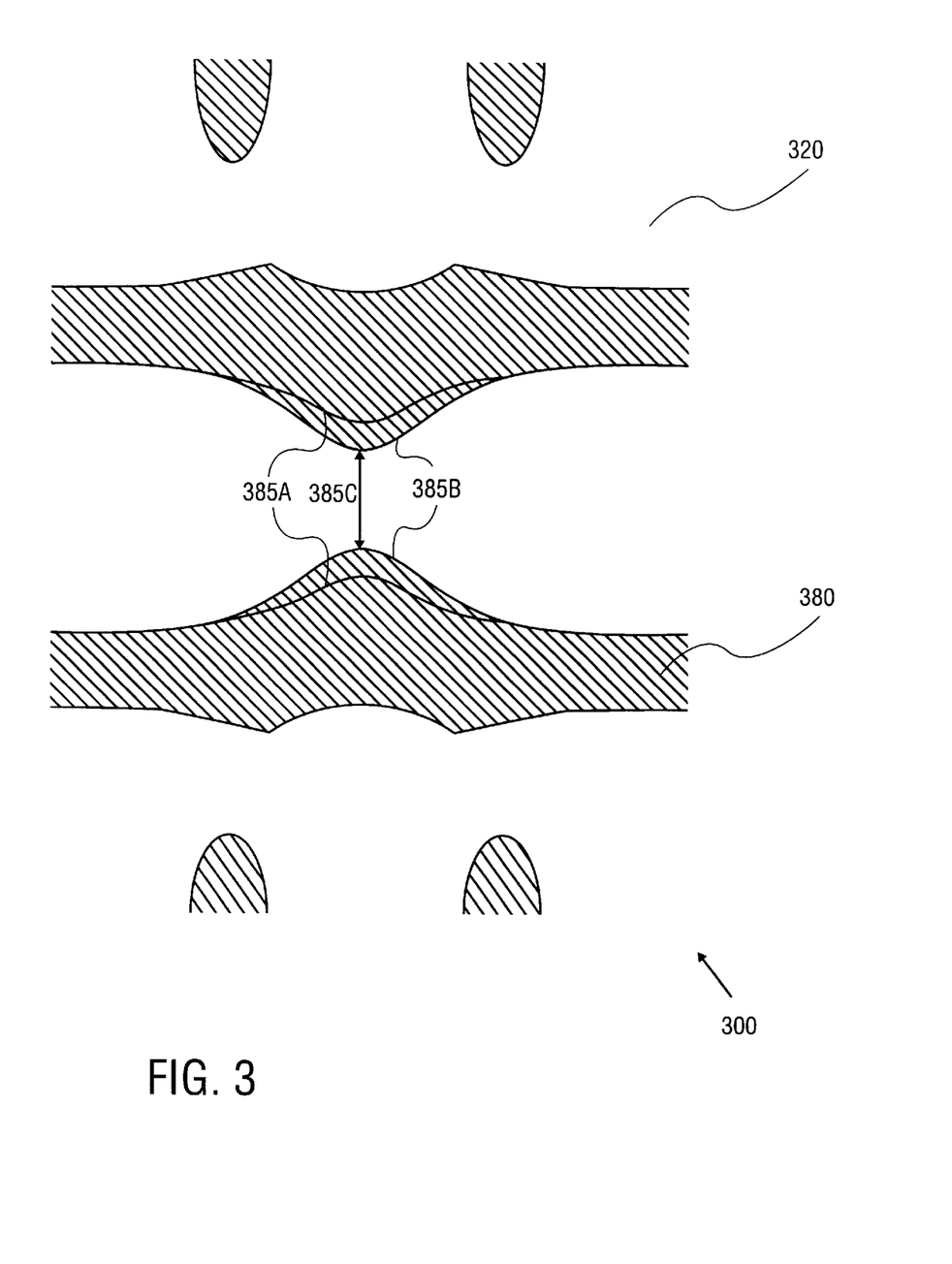
FIG. 3 is an illustration of a wafer after exposure with two masks in the prior art.

FIG. 3 shows the result of exposing the photoresist on a wafer 300 with the PSM 100 of FIG. 1 and the binary mask 200 of FIG. 2, followed by developing. When a positive-tone photoresist is used, the product features are defined by a first area 320, where photoresist has been removed, and by a second area 380, where photoresist still remains. If a negative-tone photoresist is used, the location of the photoresist will be reversed. In other words, photoresist will remain in the first area 320 while photoresist will be removed from the second area 380 (not shown).

Process window for lithography is often determined by measuring the critical dimension (CD) of a product feature as a function of exposure dose and focus. The collected data may be presented in a Bossung contour plot to help select a nominal exposure dose and a nominal focus that will result in the largest process window. However, the location of the edge of the photoresist 380 after develop may still fluctuate due to process variability. When the exposure dose and focus are optimized, the adjacent product features may have edges 385a. However, when the process is not optimized, the adjacent product features may have edges 385b. In the latter case, the desired space 385c between the adjacent product features may be so small as to risk bridging between the adjacent product features.

Figure 4:
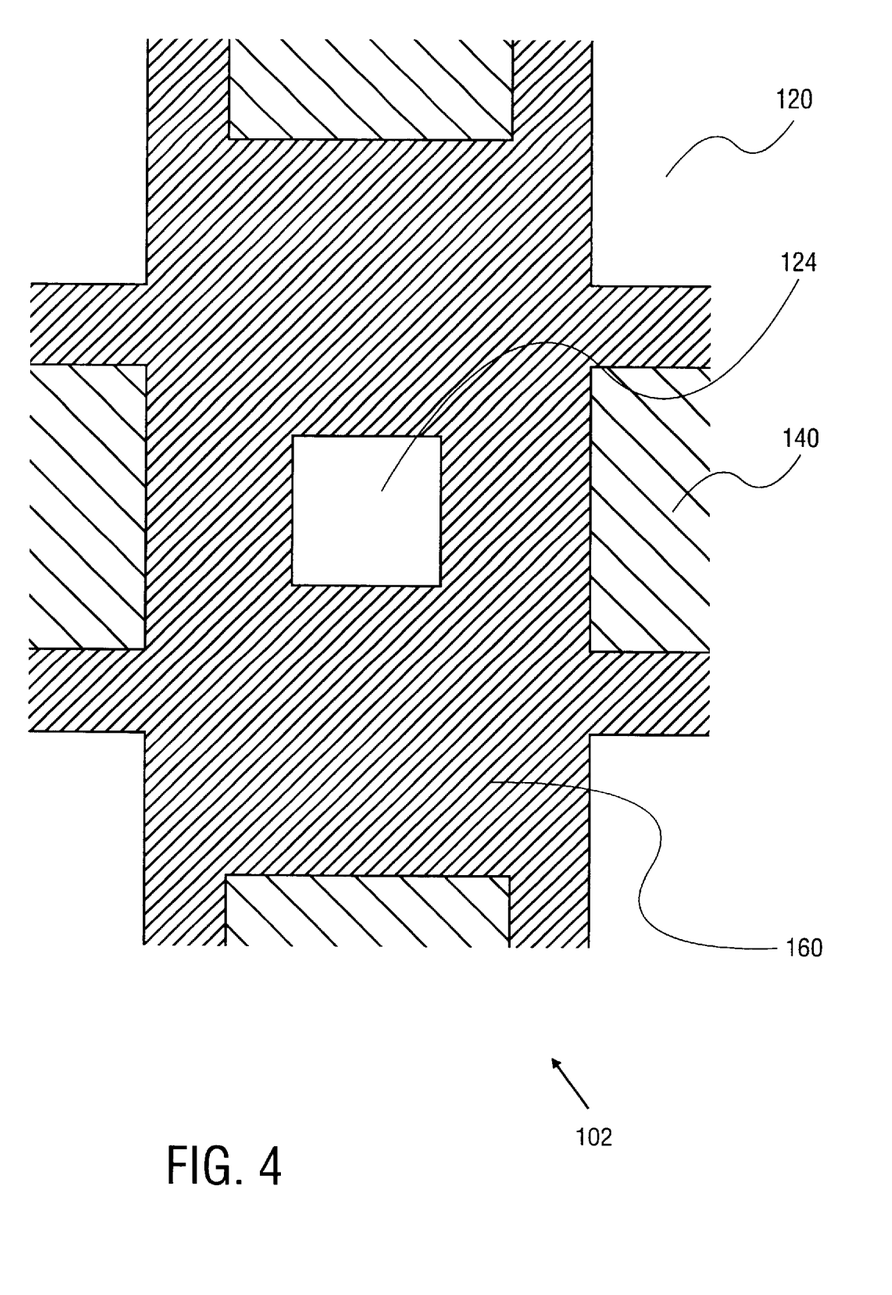
FIG. 4 is an illustration of a phase-shifting mask with an assist feature having phase of 0 degree.
Figure 7:
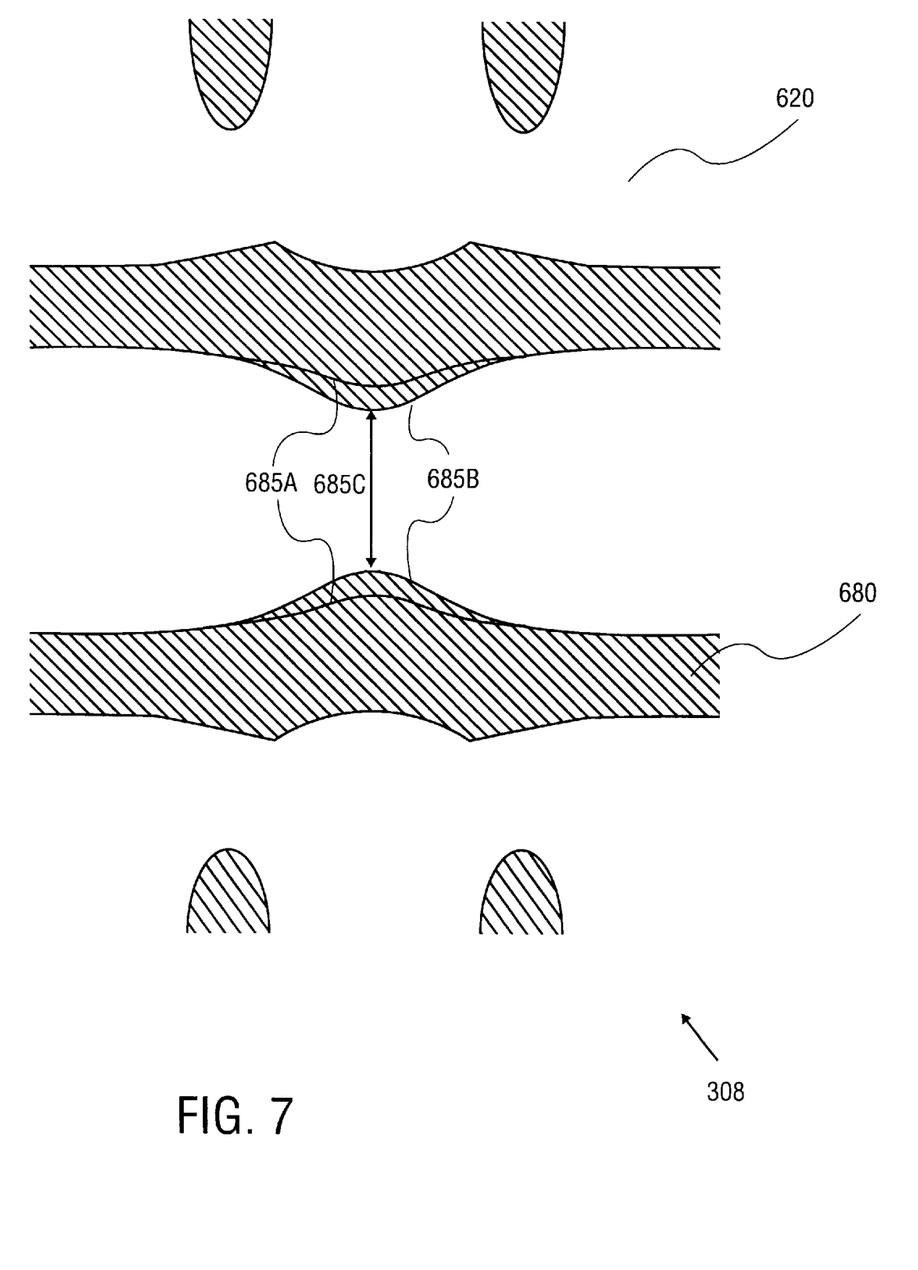
FIG. 7 is an illustration of a wafer after exposures with a binary mask and a phase-shifting mask with assist features.

In one embodiment of the present invention, an assist feature is added to help define a very small space between the adjacent product features and thus prevent bridging between the adjacent product features. FIG. 4 shows a PSM 102 that includes an assist feature 124 with a phase of 0 degree that will increase exposure between the adjacent product features that are at the same location on the binary mask 200 of FIG. 2 and help prevent bridging when the dose or focus is not optimized. As a result, the overall print exposure latitude is enhanced. Sensitivity to defects is also reduced. FIG. 7 shows the photoresist on a wafer 308 after exposure with two masks that have been properly aligned. The adjacent product features will now have edges 685a when the exposure dose and focus are optimized. Even when the process is not optimized, the adjacent product features will have edges 685b which are still satisfactory since the desired space 685c is large enough to prevent bridging between the adjacent product features.

The assist feature 124 is shown in FIG. 4 as having a discrete square shape, but it may have any shape and dimension that is appropriate for the geometry of the product features to be printed with the PSM 100 in that location on the wafer.

Figure 5:
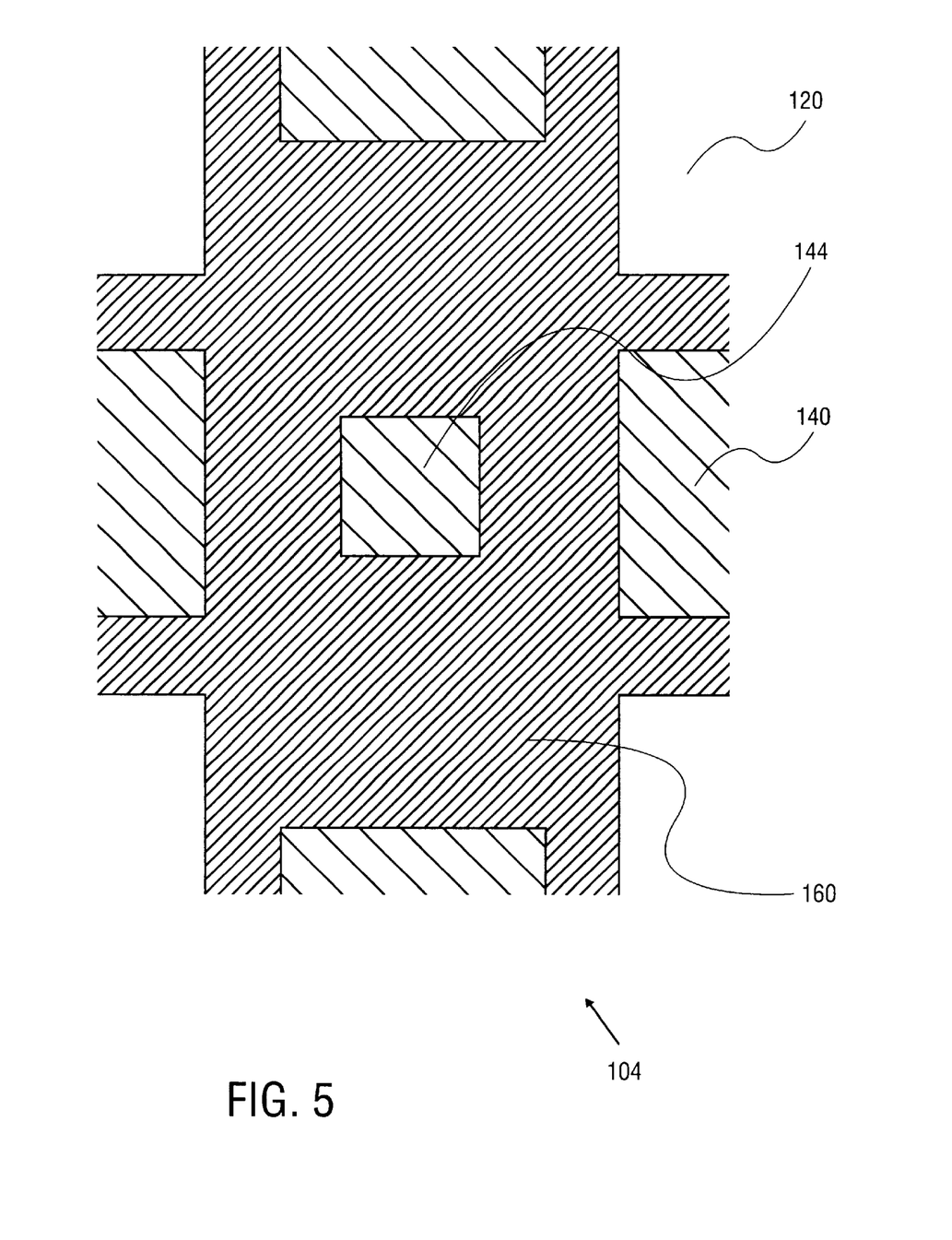
FIG. 5 is an illustration of a phase-shifting mask with an assist feature having phase of 180 degrees.

The phase of the assist feature does not have to be 0 degree. In another embodiment of the present invention, the assist feature 144 is shown in FIG. 5 with a phase of 180 degrees. FIG. 7 shows the photoresist on a wafer 308 after exposure with two masks that have been properly aligned.

Figure 6:
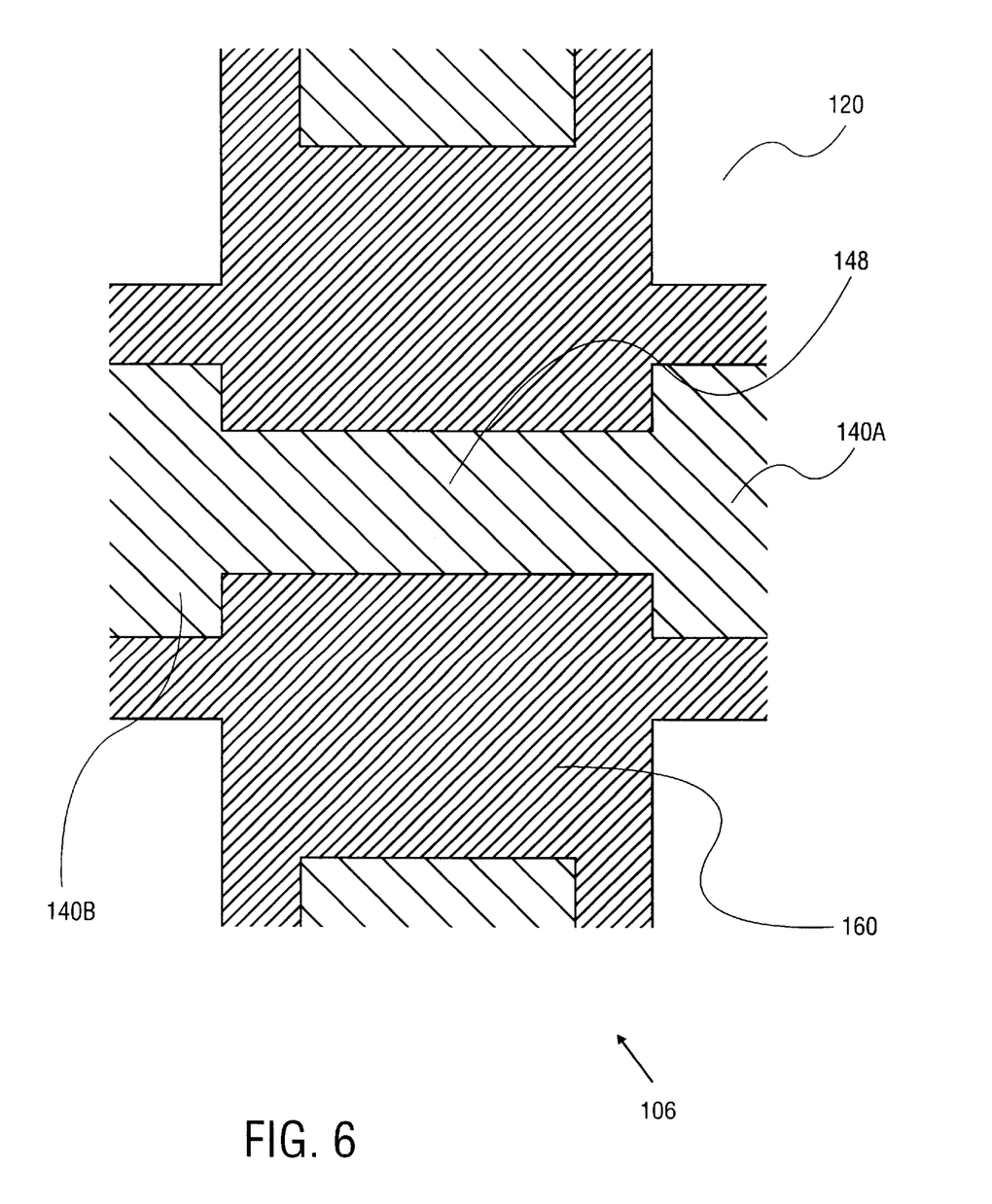
FIG. 6 is an illustration of a phase-shifting mask with an assist feature having phase of 180 degrees merged into adjacent transparent regions.

Instead of having a discrete shape, the assist feature 148, in still another embodiment of the present invention, may be merged into adjacent transparent regions 140a and 140b, as shown in FIG. 6. The assist feature 148 is shown in FIG. 6 as having the same phase as the transparent regions 140a and 140b. In this case, the phase is uniformly 180 degrees after merging together.

In a different embodiment, the phase of the assist feature 148 may be uniformly 0 degree after merging into adjacent transparent regions 140a and 140b (not shown).

It is also possible for the assist feature 148 to remain different in phase from the transparent regions 140*a* and 140*b* even after merging together as long as all undesirable artifacts printed by the PSM are removed by the binary mask. FIG. 7 shows the photoresist on a wafer 308 after exposure with two masks that have been properly aligned.

The discrete assist feature 124 in FIG. 4, the discrete assist feature 144 in FIG. 5, and the merged assist feature 148 in FIG. 6 are shown as transparent shapes surrounded by, or adjacent to, what would otherwise be entirely opaque regions on the PSM (102 in FIG. 4, 104 in FIG. 5, 106 in FIG. 6, respectively).

In another embodiment, the assist feature may be a transparent shape inserted into what would otherwise be entirely opaque regions on the binary mask 200 (not shown).

In certain situations, it may be desired that the assist feature be an opaque shape inserted into what would otherwise be entirely transparent regions on the PSM 100 or the binary mask 200 (not shown). Similarly to some of the embodiments claimed for a transparent assist feature, such an opaque assist feature may be discrete or merged into adjacent opaque regions.

In still another embodiment, the assist feature may be half-tone (not shown), rather than being completely transparent or completely opaque. A half-tone assist feature may be created by using a stack of one or more materials with the appropriate combination of optical properties and film thicknesses.

If desired, the degree of transparency or opaqueness of the assist feature may vary as a function of the wavelength of the exposure light. Alternatively, the transparency or opaqueness may vary as a function of the polarization state of the exposure light.

Analogously the product feature on a mask, an assist feature may further include optical proximity correction (OPC). OPC is helpful when an exposure tool uses incoherent or partially coherent illumination. OPC boosts the amplitude of the high spatial frequencies in the aerial image that are normally attenuated by the optics in the exposure tool. The assist feature is modified by adding serifs, cutouts, and jogs which are intentionally designed to be below the resolution limit of the exposure tool so they cannot be printed with high fidelity in the photoresist on the wafer. When properly aligned and exposed, an assist feature with OPC (on one mask) can modify the aerial image so that product features (in the same vicinity on the other mask) can be printed with high fidelity.

Figure 8:
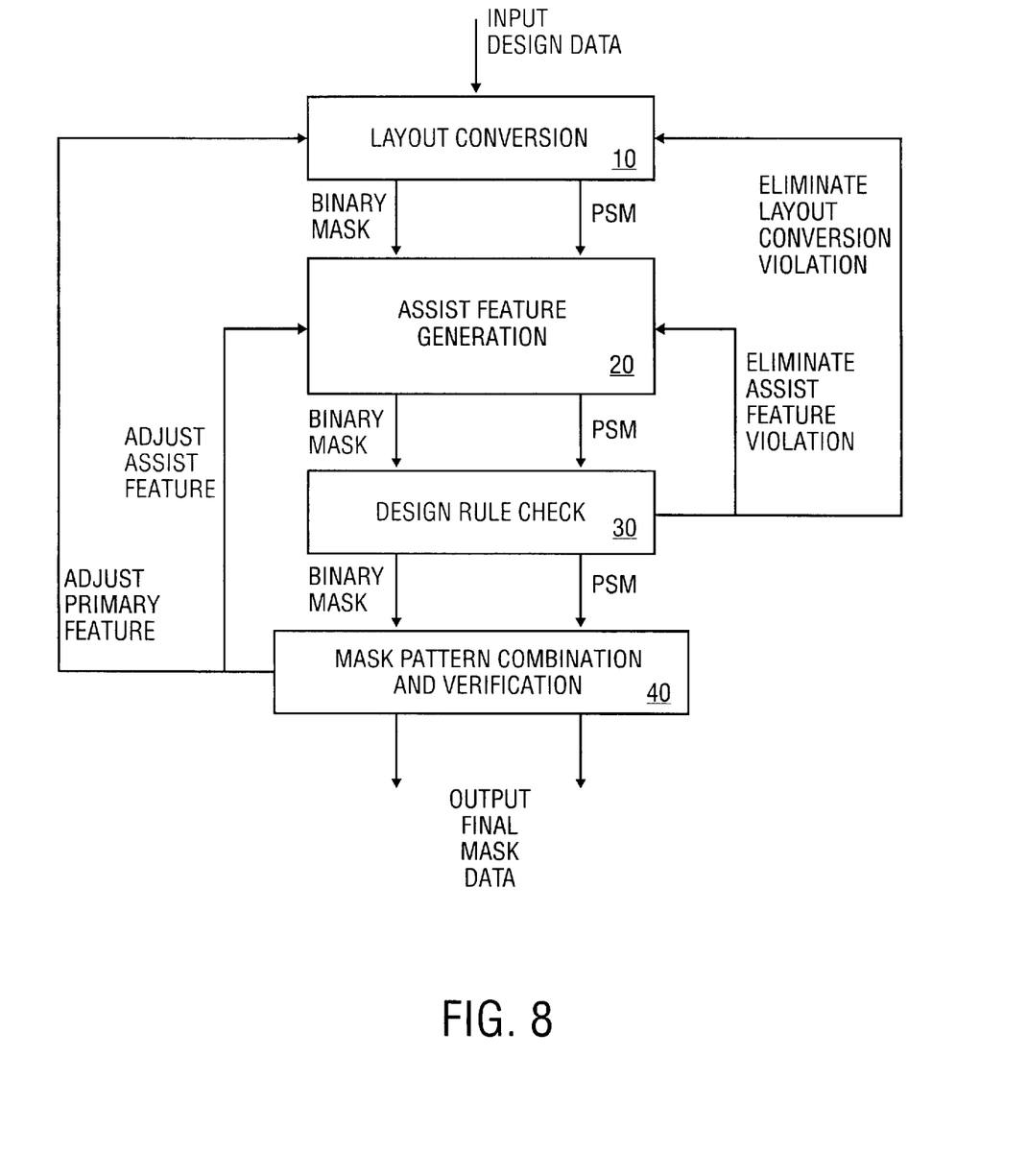
FIG. 8 is an illustration of a flowchart for generation of a binary mask and a phase-shifting mask with assist features.

In another embodiment of the present invention, the generation of assist features is integrated into an automated procedure for generating a set of mask patterns from a desired product layout. The procedure is iterative with closed-loop feedback. An example would be the generation of assist features in the patterns on the two masks used with the "hidden-shifter" alternating phase-shifting mask approach, as shown in FIG. 8. Assist features are used to modify the exposure locally so as to enhance the process latitude globally. Sensitivity to variation in exposure dose and focus is decreased. Imperfections in printing certain aspects of the smaller features on a critical layer are minimized. Undesirable defects in the photoresist include bridging of product features separated by a narrow space, necking down of narrow product features, rounding of corners in product features, and shortening of line ends in product features.

First, design data and design rules for a layout are provided as input.

Second, as shown in block 10, the design data for the layout are converted into primary features for a set of mask patterns, such as a binary mask and a PSM.

Third, as shown in block 20, assist features are generated, as needed and as appropriate, corresponding to primary features on the mask patterns. The assist feature generation may be based on rules, models, or a combination of rules and models. For example, an aerial image simulator that has been calibrated with experimentally collected data may be used.

In general, assist features will not appear explicitly in the image that is finally printed in the photoresist on a wafer. Assist features may have any shape and dimension that is appropriate to help define the geometry of the product features to be printed in that vicinity of the wafer. The definition of the product features is helped by correcting the exposure locally. Assist features may be standalone or may be merged into one or more adjacent features on a mask.

Assist features may be placed on the PSM, on the binary mask, or on both the PSM and the binary mask. For example, a transparent assist feature may be inserted into an otherwise opaque region on the PSM to add exposure to a transparent region on the binary mask that prints a narrow space. A narrow space may be required on a critical layer, such as the polysilicon layer. The assist feature may include optical proximity correction (OPC), such as serifs, cutouts, and jogs.

Fourth, as shown in block 30, the layout conversion and the assist feature generation are checked for violations of the design rules.

Fifth, the layout conversion and the assist feature generation are repeated to eliminate violations of the design rules.

Sixth, as shown in block 40, the mask patterns are combined and verified. Verification may include simulation of lithography, such as photoresist apply, exposure, and develop processes. Verification may also include simulation of etch processes.

Seventh, the primary features and the assist features are adjusted as needed to achieve the desired product layout.

Eighth, the final mask data are obtained as output. The mask data may then be used to create the mask patterns. For example, a laser writer may be used to write the binary mask and an e-beam writer may be used to write the PSM.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

We claim:

1. A set of masks comprising:
   a first mask comprising:
      a first transparent region; and
      a first opaque region, said first opaque region disposed adjacent to said first transparent region; and
   a second mask comprising:
      a second transparent region, said second transparent region having a first phase;
      a second opaque region, said second opaque region disposed adjacent to said second transparent region;

a third transparent region, said third transparent region having a second phase, said third transparent region disposed adjacent to said second opaque region; and a transparent assist feature disposed adjacent to said second opaque region, wherein said transparent assist feature will fit within said first transparent region when said second mask and said first mask are aligned.

2. The set of masks of claim 1 wherein said first phase and said second phase are offset by 180 degrees.

3. The set of masks of claim 1 wherein said first phase is 0 degree and said second phase is 180 degrees.

4. The set of masks of claim 1 wherein said transparent assist feature has said first phase.

5. The set of masks of claim 1 wherein said transparent assist feature has said second phase.

6. The set of masks of claim 1 wherein said second transparent region is disposed adjacent to said third transparent region.

7. The set of masks of claim 1 wherein said first transparent region and said transparent assist feature expose a first part of a layer.

8. The set of masks of claim 1 wherein said second transparent region and said third transparent region expose a second part of a layer.

9. The set of masks of claim 1 wherein said transparent assist feature is surrounded by said second opaque region.

10. The set of masks of claim 1 wherein said transparent assist feature is merged with said second transparent region.

11. The set of masks of claim 1 wherein said transparent assist feature is merged with said third transparent region.

12. The set of masks of claim 1 wherein said assist feature further includes optical proximity correction (OPC).

13. A set of masks comprising:
a binary mask comprising a product feature, said product feature including a narrow space; and
a phase-shifting mask comprising an assist feature, said assist feature fitting within said narrow space when said phase-shifting mask and said binary mask are aligned.

14. The set of masks of claim 13 wherein said assist feature comprises optical proximity correction (OPC).

15. The set of masks of claim 13 wherein said phase-shifting mask is an alternating aperture phase-shifting mask.

* * * * *

UNITED STATES PATENT AND TRADEMARK OFFICE
CERTIFICATE OF CORRECTION

PATENT NO. : 6,632,576 B2 Page 1 of 1
DATED : October 14, 2003
INVENTOR(S) : Tejnil It is certified that error appears in the above-identified patent and that said Letters Patent is hereby corrected as shown below:

<u>Column 5,</u>
Line 35, delete "the" and insert -- to a --.

Signed and Sealed this

Ninth Day of March, 2004

JON W. DUDAS
*Acting Director of the United States Patent and Trademark Office*